(12) United States Patent
Silveira et al.

(10) Patent No.: US 10,928,145 B2
(45) Date of Patent: Feb. 23, 2021

(54) DUAL ZONE COMMON CATCH HEAT EXCHANGER/CHILLER

(71) Applicant: Applied Materials, Inc., Santa Clara, CA (US)

(72) Inventors: Fernando Silveira, Livermore, CA (US); Brad L. Mays, Findlay, OH (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/297,474

(22) Filed: Mar. 8, 2019

(65) Prior Publication Data

US 2019/0204032 A1 Jul. 4, 2019

Related U.S. Application Data

(62) Division of application No. 13/647,314, filed on Oct. 8, 2012, now Pat. No. 10,274,270.

(Continued)

(51) Int. Cl.
*F28F 27/02* (2006.01)
*H01J 37/32* (2006.01)
*F28D 21/00* (2006.01)

(52) U.S. Cl.
CPC ........ *F28F 27/02* (2013.01); *H01J 37/32724* (2013.01); *F28D 2021/0077* (2013.01); *H01J 2237/2001* (2013.01)

(58) Field of Classification Search
None
See application file for complete search history.

(56) References Cited

U.S. PATENT DOCUMENTS

| 5,435,145 A | 7/1995 | Jaster |
| 5,435,379 A | 7/1995 | Moslehi et al. |

(Continued)

FOREIGN PATENT DOCUMENTS

| CN | 1956143 | 5/2007 |
| CN | 101320675 | 12/2008 |

(Continued)

OTHER PUBLICATIONS

Notification of Transmittal of the International Search Report and the Written Opinion dated Jan. 2, 2013 for PCT/US2012/059573, International filing date Oct. 10, 2012.

(Continued)

*Primary Examiner* — Jiong-Ping Lu
(74) *Attorney, Agent, or Firm* — Schwabe, Williamson & Wyatt, P.C.

(57) ABSTRACT

Methods and systems for controlling temperatures in plasma processing chamber via pulsed application of heating power and pulsed application of cooling power. In an embodiment, fluid levels in each of a hot and cold reservoir coupled to the temperature controlled component are maintained in part by a coupling each of the reservoirs to a common secondary reservoir. Heat transfer fluid is pumped from the secondary reservoir to either the hot or cold reservoir in response to a low level sensed in the reservoir. In an embodiment, both the hot and cold reservoirs are contained in a same platform as the secondary reservoir with the hot and cold reservoirs disposed above the secondary reservoir to permit the secondary reservoir to catch gravity driven overflow from either the hot or cold reservoir.

11 Claims, 5 Drawing Sheets

Related U.S. Application Data

(60) Provisional application No. 61/552,188, filed on Oct. 27, 2011.

(56) References Cited

U.S. PATENT DOCUMENTS

| | | | |
|---|---|---|---|
| 5,548,470 | A | 8/1996 | Husain et al. |
| 5,644,467 | A | 7/1997 | Steger et al. |
| 6,026,986 | A | 2/2000 | Choi et al. |
| 6,125,025 | A | 9/2000 | Howald et al. |
| 6,142,208 | A | 11/2000 | Eberhardt et al. |
| 6,221,205 | B1 | 4/2001 | Blalock et al. |
| 6,266,968 | B1 | 7/2001 | Redlich |
| 6,340,643 | B2 | 1/2002 | Ueda |
| 6,606,234 | B1 | 8/2003 | Divakar |
| 6,634,117 | B2 | 10/2003 | Gmeiner et al. |
| 6,651,761 | B1 | 11/2003 | Hrovat et al. |
| 6,782,843 | B2 | 8/2004 | Kinnard et al. |
| 6,891,124 | B2 | 5/2005 | Denton et al. |
| 6,921,724 | B2 | 7/2005 | Kamp et al. |
| 7,069,984 | B2 | 7/2006 | Jeong |
| 7,200,996 | B2 | 4/2007 | Cogswell et al. |
| 7,221,553 | B2 | 5/2007 | Nguyen et al. |
| 7,410,916 | B2 | 8/2008 | Ho et al. |
| 8,002,025 | B2 * | 8/2011 | Audette ............ H01L 21/67109 165/104.19 |
| 8,226,769 | B2 | 7/2012 | Matyushkin et al. |
| 8,274,017 | B2 | 9/2012 | Yap et al. |
| 8,608,852 | B2 | 12/2013 | Madaheswaraswamy et al. |
| 2002/0073727 | A1 | 6/2002 | Sheehan |
| 2002/0162175 | A1 | 11/2002 | Berglund |
| 2003/0127188 | A1 | 7/2003 | Matsumoto et al. |
| 2003/0186545 | A1 | 10/2003 | Kamp et al. |
| 2003/0205328 | A1 | 11/2003 | Kinnard et al. |
| 2006/0027324 | A1 | 2/2006 | Makino et al. |
| 2006/0076109 | A1 | 4/2006 | Holland et al. |
| 2006/0196451 | A1 | 9/2006 | Braun et al. |
| 2006/0269691 | A1 | 11/2006 | Saki |
| 2006/0283549 | A1 | 12/2006 | Aramaki et al. |
| 2007/0032087 | A1 | 2/2007 | Nishino et al. |
| 2007/0080136 | A1 | 4/2007 | Takata et al. |
| 2007/0084563 | A1 | 4/2007 | Holland |
| 2007/0091537 | A1 | 4/2007 | Buchberger |
| 2007/0258186 | A1 | 11/2007 | Matyushkin et al. |
| 2008/0023139 | A1 | 1/2008 | Yasui et al. |
| 2008/0035306 | A1 | 2/2008 | White et al. |
| 2008/0060368 | A1 | 3/2008 | Campbell et al. |
| 2008/0060978 | A1 | 3/2008 | Wegner |
| 2008/0148706 | A1 | 6/2008 | Beauregard |
| 2008/0224273 | A1 | 9/2008 | America et al. |
| 2008/0271471 | A1 | 11/2008 | Nozawa et al. |
| 2008/0311756 | A1 | 12/2008 | Chen et al. |
| 2008/0314564 | A1 | 12/2008 | Nagaseki et al. |
| 2009/0044752 | A1 | 2/2009 | Furuya |
| 2009/0060978 | A1 | 3/2009 | Bluecher |
| 2009/0065181 | A1 | 3/2009 | Mockry et al. |
| 2009/0095218 | A1 | 4/2009 | Meinhold et al. |
| 2009/0118872 | A1 | 5/2009 | Nonaka et al. |
| 2009/0155437 | A1 | 6/2009 | Bohnert et al. |
| 2009/0183677 | A1 | 7/2009 | Tian et al. |
| 2009/0229638 | A1 | 9/2009 | Yun et al. |
| 2009/0294101 | A1 | 12/2009 | Fovell et al. |
| 2009/0310645 | A1 | 12/2009 | Kofuji et al. |
| 2010/0083952 | A1 | 4/2010 | van Houten |
| 2010/0116788 | A1 | 5/2010 | Singh et al. |
| 2010/0210041 | A1 | 8/2010 | Chang et al. |
| 2011/0186545 | A1 * | 8/2011 | Mahadeswaraswamy ................... H01J 37/3244 216/59 |
| 2012/0048467 | A1 | 3/2012 | Mahadeswaraswamy et al. |
| 2012/0132397 | A1 | 5/2012 | Silveira et al. |
| 2013/0023122 | A1 | 1/2013 | Nemani et al. |
| 2013/0023123 | A1 | 1/2013 | Zhou et al. |
| 2013/0023124 | A1 | 1/2013 | Nemani et al. |
| 2013/0109187 | A1 | 5/2013 | Nemani et al. |
| 2013/0109188 | A1 | 5/2013 | Kim et al. |
| 2013/0224962 | A1 | 8/2013 | Koelmel et al. |
| 2013/0279066 | A1 | 10/2013 | Lubomirsky et al. |
| 2017/0323813 | A1 * | 11/2017 | Silveira .................. C23C 16/52 |

FOREIGN PATENT DOCUMENTS

| | | |
|---|---|---|
| CN | 101583234 | 11/2009 |
| EP | 0766300 | 4/1997 |
| EP | 1770753 | 12/2010 |
| JP | H0796170 | 4/1995 |
| JP | H0855905 | 2/1996 |
| JP | H09129717 | 5/1997 |
| JP | 200160585 | 3/2001 |
| JP | 2002009049 | 1/2002 |
| JP | 2002071234 | 3/2002 |
| JP | 2002526923 | 8/2002 |
| JP | 200463670 | 2/2004 |
| JP | 2004508728 | 3/2004 |
| JP | 2004169933 | 6/2004 |
| JP | 2005079415 | 3/2005 |
| JP | 2005150173 | 6/2005 |
| JP | 2005175460 | 6/2005 |
| JP | 2006049497 | 2/2006 |
| JP | 2007501907 | 4/2006 |
| JP | 2006351887 | 12/2006 |
| JP | 2007088394 | 4/2007 |
| JP | 2007157696 | 6/2007 |
| JP | 2001237266 | 12/2007 |
| JP | 2007316039 | 12/2007 |
| JP | 2008177428 | 7/2008 |
| JP | 3147392 | 12/2008 |
| JP | 2010050463 | 3/2010 |
| JP | 2010050464 | 3/2010 |
| JP | 2010062570 | 3/2010 |
| JP | 2010097854 | 4/2010 |
| JP | 2008305856 | 5/2010 |
| KR | 1020090107261 | 12/2008 |
| KR | 1020090118839 | 11/2009 |
| TW | 1358765 | 10/1995 |
| TW | 200816362 | 8/1996 |
| TW | 200912989 | 6/1997 |
| TW | 1314842 | 1/2006 |
| TW | 200727325 | 7/2007 |
| TW | 200845202 | 11/2008 |
| TW | 200952068 | 12/2009 |
| TW | 201125069 | 7/2011 |
| WO | WO 0019519 | 4/2000 |
| WO | WO 0221590 | 3/2002 |
| WO | WO 201055441 | 5/2010 |

OTHER PUBLICATIONS

International Preliminary Report dated May 8, 2014 for PCT/US2012/059573 filed Oct. 10, 2012.
Doug J. Cooper, "Integral Action and Pi Control," Controlguru Practical Process Control E-Textbook, 5 pgs.
Howard, Brad, "Applied Centura Avatar Etch Enabling New Dimensions in High Aspect Ratio Etching," Silicon Systems Group, Jun. 27, 2012, 20 pgs.
Search Report for Taiwanese Application No. 100118159 filed May 24, 2011, dated Feb. 6, 2014, 4 pgs.
Chinese Office Action & Search Report for China Application No. 2011800252948 filed May 20, 2011, dated Jul. 17, 2015, 21 pgs.
International Preliminary Report on Patentability for corresponding International Application No. PCT/US2010/062435 filing date Dec. 29, 2010, dated Jul. 31, 2012, 5 pgs.
Japanese Office Action dated Aug. 17, 2015 for corresponding Japanese Application No. 2012-551168.
Search Report for Taiwan Invention App. No. 100118159; filing date May 24, 2011, dated Nov. 22, 2014.
Chinese Search Report for China App. No. 201080062730.4; filing date Dec. 29, 2010, dated Oct. 2, 2014.
International Search Report and Written Opinion for corresponding International Application No. PCT/US2010/062435, dated Aug. 22, 2011, 9 pgs.

(56) References Cited

OTHER PUBLICATIONS

International Search Report and Written Opinion for corresponding International Application No. PCT/US2011/037436, dated Nov. 28, 2011, 8 pgs.
International Search Report and Written Opinion for corresponding International Application No. PCT/US2001/039182, dated Nov. 28, 2011, 9 pgs.
International Preliminary Report on Patentability for corresponding International Application No. PCT/US2010/062435, dated Jul. 31, 2012, 5 pgs.
International Search Report and Written Opinion for corresponding International Application No. PCT/US2012/059573, dated Jan. 2, 2013, 9 pgs.
International Preliminary Report for corresponding International Application No. PCT/US2012/059573, dated Apr. 29, 2014, 5 pgs.
International Preliminary Report on Patentability and Written Opinion for corresponding International Application No. PCT/US2012/059573, dated May 8, 2014, 6 pgs.
International Preliminary Report on Patentability and Written Opinion for corresponding International Application No. PCT/US2011/037436, dated Nov. 27, 2012, 4 pgs.
Notice of Allowance for Japanese Application No. 2013-514239, dated Dec. 8, 2016, 3 pgs.
Office Action for Japanese Application No. 2013-514239, dated Jan. 13, 2016, 5 pgs.
Final Office Action for U.S. Appl. No. 12/905,624 dated Mar. 24, 2015, 13 pgs.
Final Office Action for U.S. Appl. No. 12/905,624 dated May 19, 2014, 14 pgs.
Final Office Action for U.S. Appl. No. 12/905,624 dated Jul. 12, 2013, 10 pgs.
Non-final Office Action for U.S. Appl. No. 12/905,624 dated Sep. 4, 2014, 12 pgs.
Non-final Office Action for U.S. Appl. No. 12/905,624 dated Nov. 15, 2013, 11 pgs.
Non-final Office Action for U.S. Appl. No. 12/905,624 dated Feb. 28, 2013, 15 pgs.

\* cited by examiner

DUAL ZONE COMMON CATCH HEAT EXCHANGER/CHILLER

CROSS-REFERENCE TO RELATED APPLICATIONS

This application is a divisional of U.S. patent application Ser. No. 13/647,314, now U.S. Pat. No. 10,274,270, filed on Oct. 8, 2012, which claims the benefit of U.S. Provisional Application No. 61/552,188 filed on Oct. 27, 2011 titled "DUAL ZONE COMMON CATCH HEAT EXCHANGER/ CHILLER," the entire contents of which are hereby incorporated by reference in its entirety for all purposes. This application is related to U.S. Non-provisional application Ser. No. 13/111,334 filed on May 19, 2011, titled "TEMPERATURE CONTROL IN PLASMA PROCESSING APPARATUS USING PULSED HEAT TRANSFER FLUID FLOW."

TECHNICAL FIELD

Embodiments of the present invention generally relate to plasma processing equipment, and more particularly to methods of controlling temperatures during processing of a workpiece with a plasma processing chamber.

BACKGROUND

In a plasma processing chamber, such as a plasma etch or plasma deposition chamber, the temperature of a chamber component is often an important parameter to control during a process. For example, a temperature of a substrate holder, commonly called a chuck or pedestal, may be controlled to heat/cool a workpiece to various controlled temperatures during the process recipe (e.g., to control an etch rate). Similarly, a temperature of a showerhead/upper electrode or other component may also be controlled during the process recipe to influence the processing. Conventionally, a heat sink and/or heat source is coupled to the processing chamber to maintain the temperature of a chamber component at a desired temperature. To accommodate increasingly complex film stacks, many plasma processes expose a workpiece to a number of sequential plasma conditions within a same processing chamber. Operations in such in-situ recipes (performed within a single manufacturing apparatus rather than in separately tuned systems) may require temperature setpoints spanning a wide range.

SUMMARY

Methods and systems for controlling temperatures in plasma processing chamber via pulsed application of heating power and pulsed application of cooling power are described. In an embodiment, fluid levels in each of a hot and cold reservoir coupled to the temperature controlled component are maintained in part by a secondary reservoir shared in common by the hot and cold reservoirs with a pump coupling each of the hot and cold reservoirs to the secondary reservoir. The pump is actively controlled by a level sensor in each of the hot and cold reservoirs to maintain the heat transfer fluid level. The secondary reservoir may be disposed below both of the hot and cold reservoirs to passively catch overspill from either the hot or cold heat transfer loops in the event cross-talk between the loops.

BRIEF DESCRIPTION OF THE DRAWINGS

Embodiments of the invention are particularly pointed out and distinctly claimed in the concluding portion of the specification. Embodiments of the invention, however, both as to organization and method of operation, together with objects, features, and advantages thereof, may best be understood by reference to the following detailed description when read with the accompanying drawings in which:

DETAILED DESCRIPTION

In the following detailed description, numerous specific details are set forth in order to provide a thorough understanding of embodiments of the invention. However, it will be understood by those skilled in the art that other embodiments may be practiced without these specific details. In other instances, well-known methods, procedures, components and circuits have not been described in detail so as not to obscure the present invention. Some portions of the detailed description that follows are presented in terms of algorithms and symbolic representations of operations on data bits or binary digital signals within a computer memory. These algorithmic descriptions and representations may be the techniques used by those skilled in the data processing arts to convey the substance of their work to others skilled in the art.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause an effect relationship).

Figure 1:
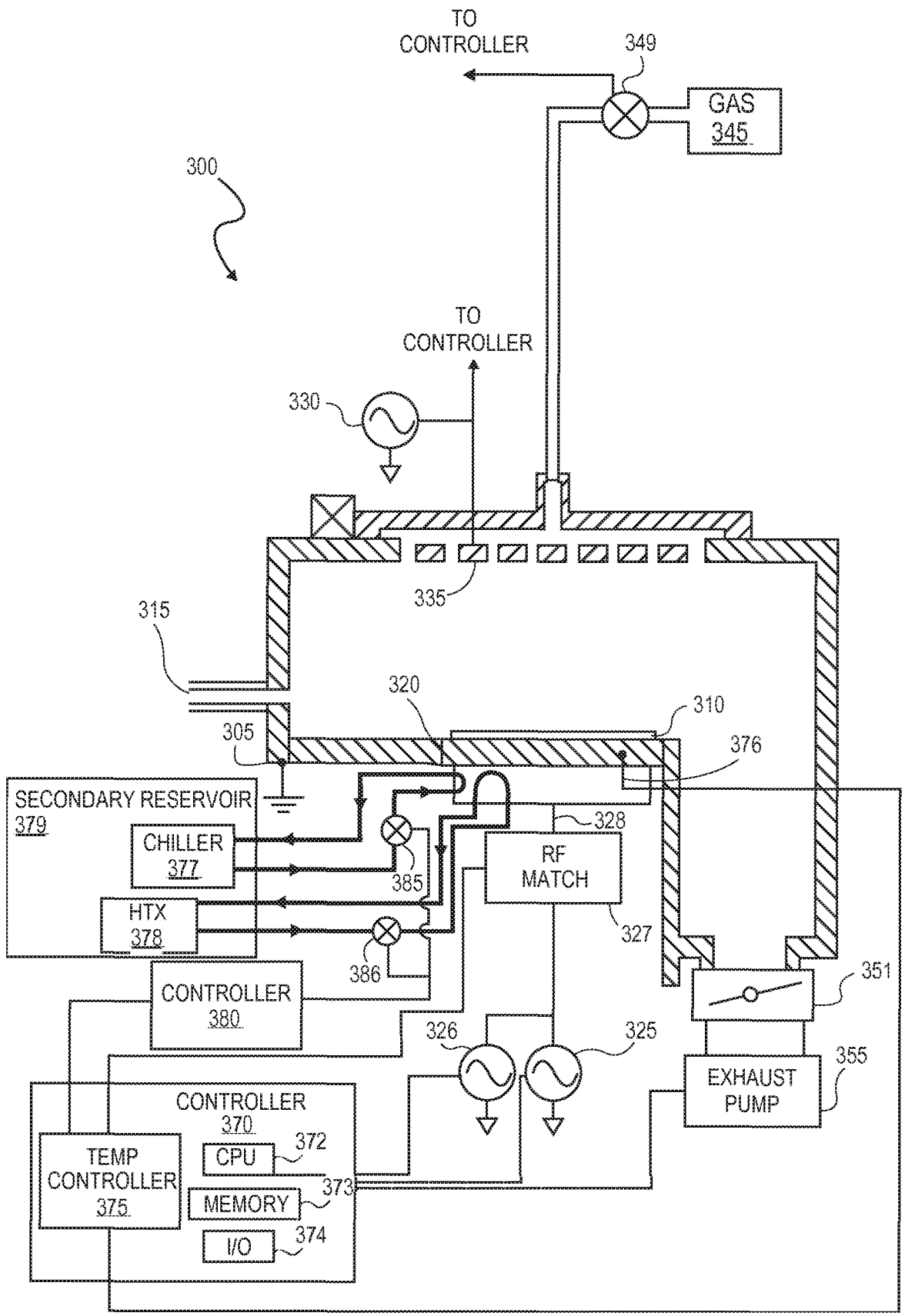
FIG. 1 illustrates a schematic of a plasma etch system including a heat transfer fluid-based heat source and a heat transfer fluid-based heat sink coupled to a workpiece supporting chuck, in accordance with an embodiment of the present invention.

FIG. 1 illustrates a cross-sectional schematic view of a plasma etch system 300 which includes a component for which temperature is controlled. The plasma etch system 300 may be any type of high performance etch chamber known in the art, such as, but not limited to, Enabler™, MxP®, MxP+™, Super-E™, DPS II AdvantEdge™ G3, or E-MAX® chambers manufactured by Applied Materials of CA, USA. Other commercially available etch chambers may be similarly controlled. While the exemplary embodiments are described in the context of the plasma etch system 300, it should be further noted that the temperature control system architecture described herein is also adaptable to other plasma processing systems (e.g., plasma deposition systems, etc.) which present a heat load on a temperature controlled component.

The plasma etch system 300 includes a grounded chamber 305. A substrate 310 is loaded through an opening 315 and clamped to a temperature controlled electrostatic chuck 320. The substrate 310 may be any workpiece conventionally employed in the plasma processing art and the present invention is not limited in this respect. In particular embodiments, temperature controlled chuck 320 includes a plurality of zones, each zone independently controllable to a temperature setpoint which may be the same or different between the zones. In the exemplary embodiment, an inner thermal zone is proximate a center of substrate 310 and an outer thermal zone is proximate to a periphery/edge of substrate 310. Process gases, are supplied from gas source 345 through a mass flow controller 349 to the interior of the chamber 305. Chamber 305 is evacuated via an exhaust valve 351 connected to a high capacity vacuum pump stack 355.

When plasma power is applied to the chamber 305, a plasma is formed in a processing region over substrate 310. A first plasma bias power 325 is coupled to the chuck 320 (e.g., cathode) to energize the plasma. The plasma bias power 325 typically has a low frequency between about 2 MHz to 60 MHz, and in a particular embodiment, is in the 13.56 MHz band. In the exemplary embodiment, the plasma etch system 300 includes a second plasma bias power 326 operating at about the 2 MHz band which is connected to the same RF match 327 as plasma bias power 325 to provide via the RF cathode input 328 a dual frequency bias power. In one dual frequency bias power embodiment a 13.56 MHz generator supplies between 500 W and 3000 W while a 2 MHz generator supplies between 0 and 7000 W of power for a total bias power ($W_{b,tot}$) of between 500 W and 10000 W. In another dual frequency bias power embodiment a 60 MHz generator supplies between 100 W and 3000 W while a 2 MHz generator supplies between 0 and 7000 W of power for a total bias power ($W_{b,tot}$) of between 100 W and 10000 W.

A plasma source power 330 is coupled through a match (not depicted) to a plasma generating element 335 (e.g., showerhead) which may be anodic relative to the chuck 320 to provide high frequency source power to energize the plasma. The plasma source power 330 typically has a higher frequency than the plasma bias power 325, such as between 100 and 180 MHz, and in a particular embodiment, is in the 162 MHz band. In particular embodiments the top source operates between 100 W and 2000 W. Bias power more directly affects the bias voltage on substrate 310, controlling ion bombardment of the substrate 310, while source power more directly affects the plasma density. Notably, the system component to be temperature controlled by a temperature controller 375 is neither limited to the chuck 320 nor must the temperature controlled component directly couple a plasma power into the process chamber. In an alternative embodiment for example, a showerhead through which a process gas is input into the plasma process chamber is controlled with the temperature controller 375. For such showerhead embodiments, the showerhead may or may not be RF powered.

For a high bias power density (kW/workpiece area) embodiment, such as that applicable to dielectric etching, it is problematic to supply heating power to the chuck 320 via a resistive heater because of RF filtering issues. For the system 300, the chuck heating power is provided by a heat transfer fluid loop. For such embodiments, a first heat transfer fluid loop cools the chuck 320 and a second heat transfer fluid loop heats the chuck 320. In the exemplary embodiment, the temperature controller 375 is coupled, either directly, or indirectly to a chiller 377 (heat sink) and a heat exchanger 378 (heat source). The temperature controller 375 may acquire the temperature setpoint of the chiller 377 or the heat exchanger (HTX) 378. A difference between the temperature of the chiller 377 and a temperature setpoint for the chuck 320 and the difference between the temperature of the heat exchanger 378 and the temperature setpoint is input into a feedforward or feedback control line along with the plasma power (e.g., total bias power). The chiller 377 is to provide a cooling power to the chuck 320 via a coolant loop thermally coupling the chuck 320 with the chiller 377. In the exemplary embodiment therefore, two coolant loops are employed. One coolant loop has a cold liquid (e.g., Galden or Fluorinert, etc. at a temperature setpoint of −5° C. while another loop contains liquid at high temperature (e.g., Galden or Fluorinert, etc. at a temperature setpoint of 55° C.). When cooling is required a valve 385 is opened (e.g., as driven by a pulse width modulation controller 380) while a valve 386 for the heating loop is opened when heating is required. In preferred embodiments, only one of the heating and cooling valves 385 and 386 is open at any particular time such that a total fluid flow to the chuck 320 at any given time is delivered from either the chiller 377 or the HTX 378.

In an embodiment, each of the chiller 377 and HTX 378 include a reservoir (cold and hot, respectively) to contain a quantity of the heat transfer fluid that is circulated to the chuck 320 and each of the cold and hot reservoirs are fluidly coupled to a secondary reservoir 379 which is to contain a quantity of the heat transfer fluid. The secondary reservoir 379 is therefore common between both the chiller 377 and HTX 378 and is to permit active leveling of the primary reservoirs in each of the chiller 377 and HTX 378.

Figure 2A:
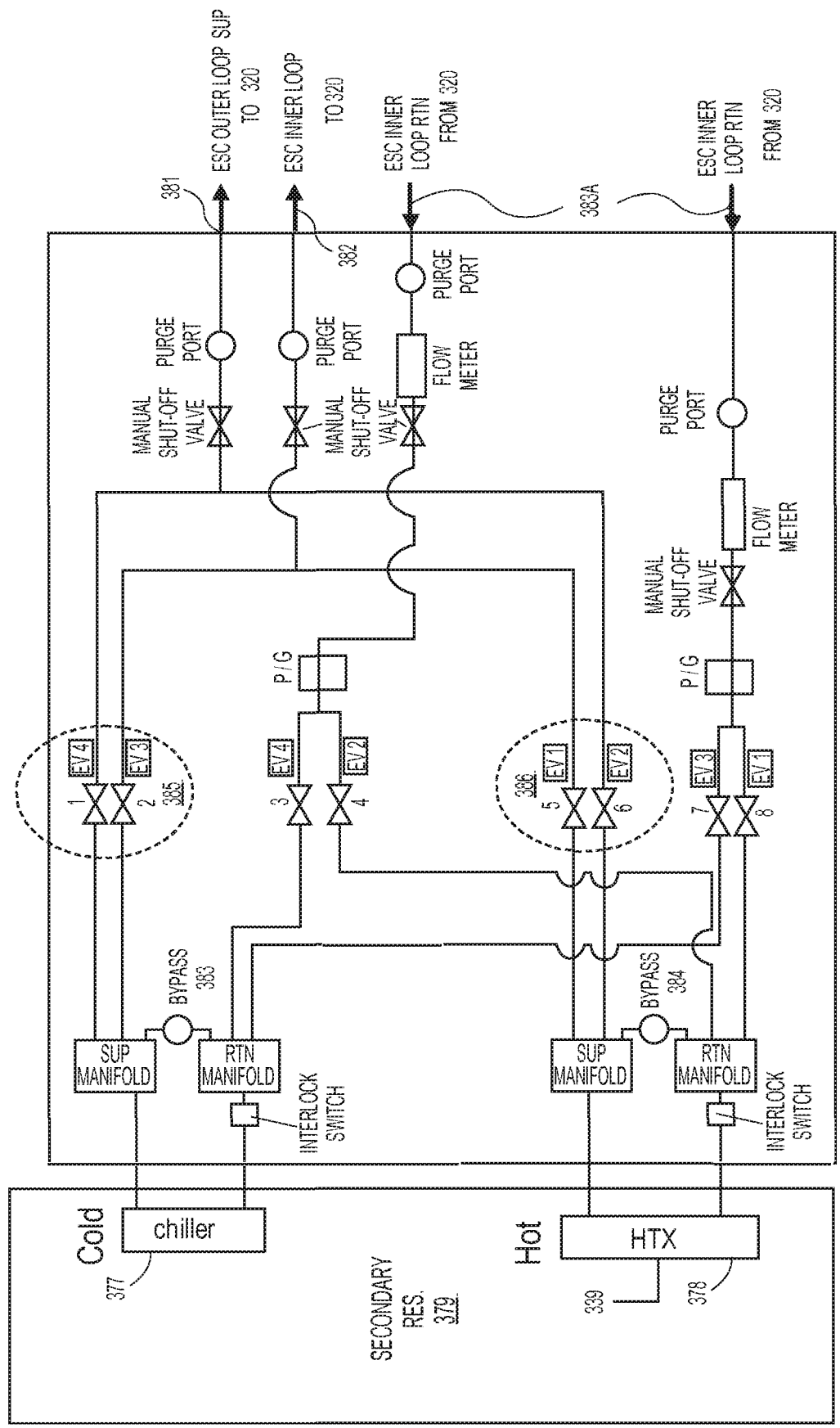
FIG. 2A illustrates a schematic of plumbing coupling a heat transfer fluid-based heat source and a heat transfer fluid-based heat sink to a workpiece supporting chuck, in accordance with an embodiment of the present invention.

FIG. 2A illustrates a valve and plumbing schematic for the heat transfer fluid-based heat source/sink employed in the plasma etch system of FIG. 1, in accordance with an embodiment of the present invention. As further depicted, a pair of heat transfer fluid supply lines 381 and 382 are coupled to the chiller 377 and a heat transfer fluid channel embedded in the chuck 320 (subjacent to a working surface of the chuck upon which substrate 310 is disposed during processing) via the valves 385 (EV 4 and EV 3, respectively). The line 381 is coupled to a heat transfer fluid channel embedded subjacent to a first, outer zone, of the chuck working surface while the line 382 is coupled to a heat transfer fluid channel embedded subjacent to a second, inner zone, of the chuck working surface to facilitate dual zone cooling. Similarly, the line 381 and 382 also couples the chuck 320 to the HTX 378 via the valves 386 (EV2 and EV 1, respectively) to facilitate dual zone heating. Return lines 383A complete the coupling of each of the inner and outer zone heat transfer fluid channels to the chiller 377/HTX 378 via return valves EV3 and EV1. Bypasses 383 and 384 allow for pump pressure to remain with in desired parameters even when one or the other of the valves 386 are closed.

Each of the chiller 377 and the HTX 378 includes a primary heat transfer fluid reservoir (i.e., tank or bath) which is to operate at a setpoint temperature to sink or source thermal energy. The secondary reservoir 379 fluidly couples the primary heat transfer fluid reservoir in the chiller 377 to the primary heat transfer fluid reservoir in the HTX 378. As shown, the chiller 377 includes an overflow conduit 338 to pass heat transfer fluid exceeding a threshold level into the secondary reservoir 379 while the HTX 378 includes a similar overflow conduit 339. In the exemplary embodiment active level control is provided by at least one pump coupled to primary fluid reservoir to transport fluid from the secondary reservoir 379 to the primary reservoir of the chiller 377 or HTX 378. In this manner, there is no need to accurately level two independent reservoirs, and external connections as well as any gravity fed equalization hardware (e.g., leveling pipes, etc.) can be eliminated to simplify system architecture. The secondary reservoir 379 is advantageous for implementations where the operation of the valves 385 and 386 (and similarly return valves EV1 and EV3) cause heat transfer fluid levels in the reservoir of the chiller 377 to deviate from levels in the reservoir of the HTX 378. This is particularly an issue where a pulsed heating/cooling is utilized such that only one of valves 385, 386 is open at any given time and each valve may be cycled frequently. Even where the return valve EV3 or EV1 is switched in phase with the valve 385 or 386, respectively, it has been found that during operation small variations in valve actuation rates, etc. can result in a net migration of heat transfer fluid between the chiller 377 and HTX 378.

Figure 2B:
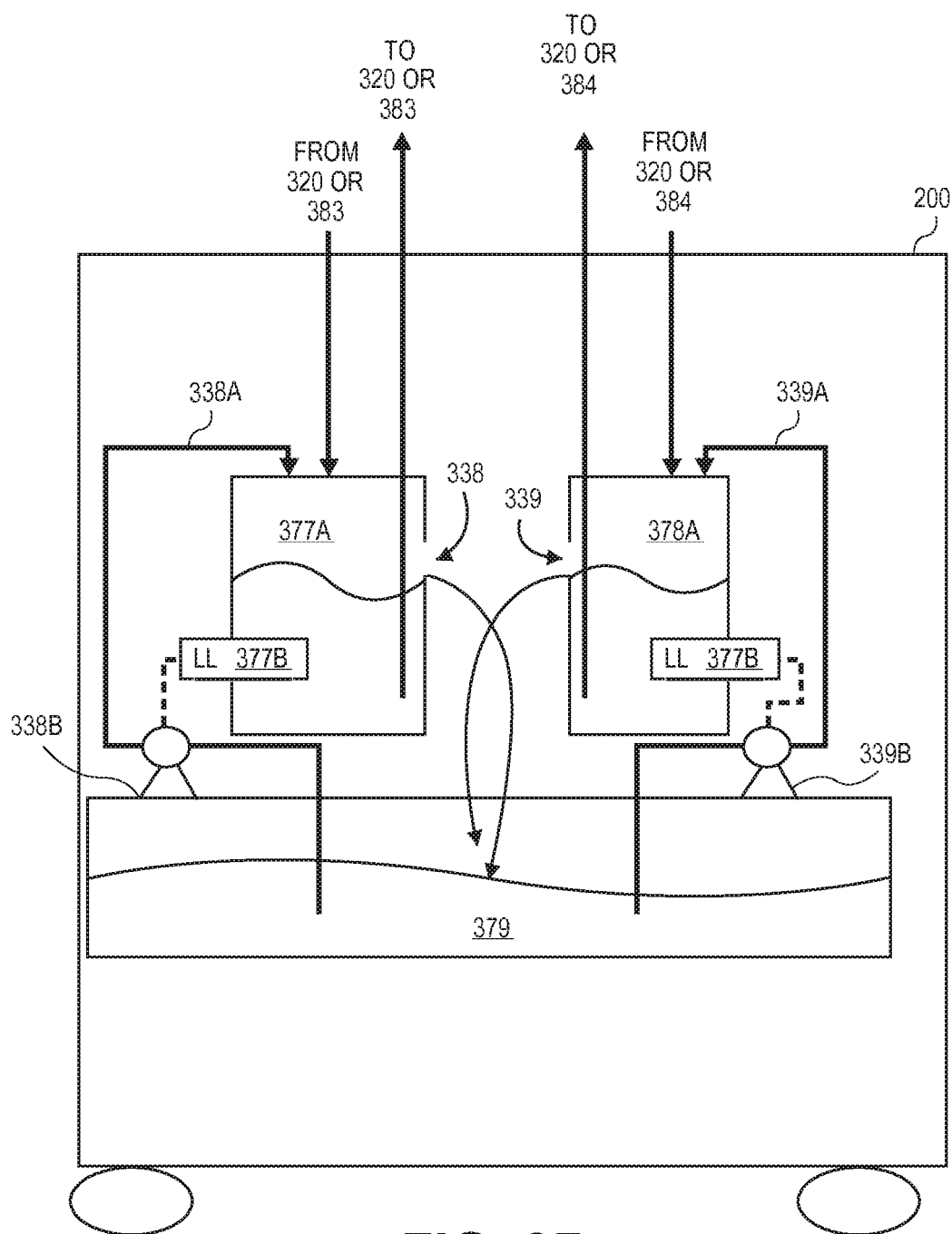
FIG. 2B illustrates a cross-section schematic of a hot and a cold heat transfer fluid reservoir sharing a common secondary reservoir employed in the heat transfer fluid-based heat source/sink depicted in FIG. 2A, in accordance with an embodiment of the present invention.

FIG. 2B further illustrates the secondary reservoir 379 disposed below cold and hot heat transfer fluid reservoirs, 377A, 378A, respectively, in accordance with an embodiment of the present invention. As depicted, a low level sensor 377B is disposed in the chiller reservoir 377A, as is a low level sensor 378B for the heat exchanger reservoir 378A. Each low level sensor is communicatively coupled to a pump configured to draw heat transfer fluid from the secondary reservoir 379 and dispense back to respective primary reservoir to replenish the heat transfer fluid. As illustrated in FIG. 2C, the pump 338B is coupled to the low level sensor 377B to replenish heat transfer fluid via the conduit 338A and the pump 339B is coupled to the low level sensor 378B to replenish heat transfer fluid via the conduit 339A. While additional pumps may be utilized to draw heat transfer liquid that from the cold and hot heat transfer fluid reservoirs, 377A, 378A in response to a high level sense and dispense back to the secondary reservoir 379, in the exemplary embodiment both the cold and hot heat transfer fluid reservoirs, 377A, 378A are disposed above the secondary reservoir 379 so that overflow from either the cold or hot heat transfer fluid reservoirs, 377A, 378A will be caught in the secondary reservoir 379. In this exemplary embodiment the overflows from the cold and hot heat transfer fluid reservoirs, 377A, 378A are gravity fed via overflow conduits 338, 338 into the secondary reservoir 379 as a common catch plenum. In the exemplary embodiment, the secondary reservoir 379 is not actively temperature controlled, such that the heat transfer fluid contained in the secondary reservoir 379 is approximately at ambient temperature of the environment (e.g., 25C). As further illustrated in FIG. 2C, the cold and hot heat transfer fluid reservoirs, 377A, 378A and the secondary reservoir 379, so arranged, are all contained within a single platform 200. Therefore, in the exemplary embodiment illustrated in FIG. 2C, the functions and components of both the chiller 377 and HTX 378 illustrated in FIGS. 1 and 2A are contained in the single platform 200. This integration of conventionally separate chiller and heat exchanger units simplifies leveling between the two heat transfer fluid loops via the secondary reservoir 379.

During operation, because each of the hot and cold coolant loops is tapped to control the chuck temperature, the platform 200 operates to negate any difference in the amount of fluid which is returned from the chuck 320 to the cold and hot reservoirs 377A, 378A, respectively. Periodically, in response to the low level sensors 377B and 378B, small deviations between the cold and hot supply and return apportionments are equalized by fluid dispensed from the leveling pumps 338B, 339B to keep the reservoirs filled to the appropriate levels. Of course, similar functionality may be achieved with a single leveling pump implemented in combination with one or more control valves actuated based on the low level sensor output. Because of the relatively small fluid transfer incurred by operation of the temperature control valves, the secondary reservoir 379 places little additional load on the HX and/or Chiller, 377, 378.

Returning to FIG. 1, the temperature controller 375 is to execute the temperature control algorithms and may be either software or hardware or a combination of both. The temperature controller 375 is to output control signals affecting the rate of heat transfer between the chuck 320 and a heat source and/or heat sink external to the plasma chamber 305. In one feedforward embodiment, with the passage of a sample time, the current controlled temperature is acquired, the temperature setpoint is acquired, and the plasma power is acquired. A temperature setpoint for the heat sink(s) may also be acquired. In the exemplary embodiment depicted in FIG. 1, the temperature controller 375 receives a controlled temperature input signal from the chuck temperature sensor 376 (e.g., optical probe). The temperature controller 375 acquires a chuck setpoint temperature from a process recipe file, for example stored in the memory 373, and the temperature controller 375 acquires a plasma power (measured or as set by a recipe file parameter).

Figure 3:
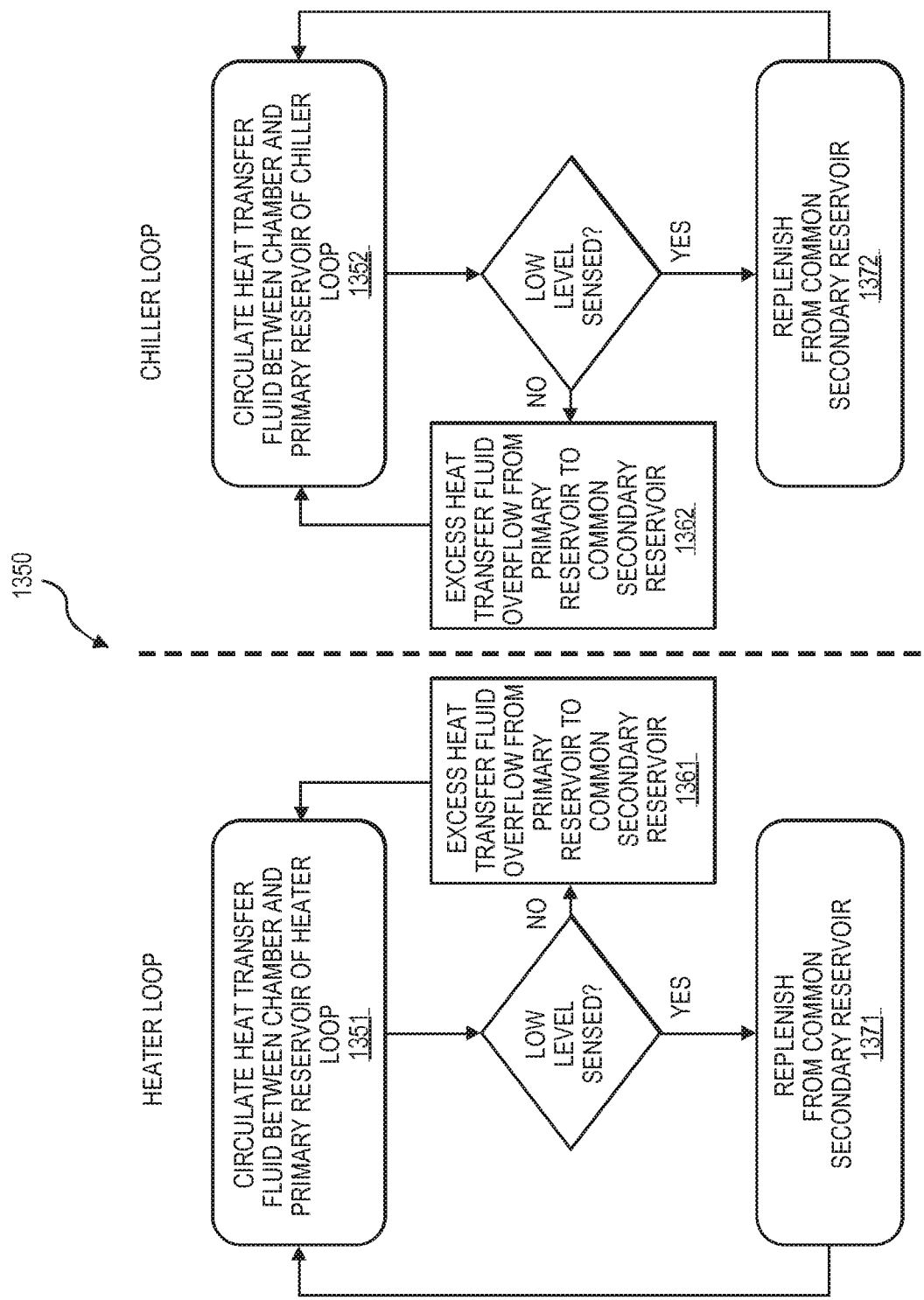
FIG. 3 illustrates a method of actively maintaining level of cold and hot heat transfer fluid reservoirs, in accordance with an embodiment of the present invention.

FIG. 3 illustrates a method 1350 of actively maintaining level of cold and hot heat transfer fluid reservoirs, in accordance with an embodiment of the present invention. For the heater loop, the method 1350 begins at operation 1351 with circulating the heat transfer fluid between the chamber 305 and the hot reservoir 378A of the HTX 378. If a low level is sensed (e.g., by the LL sensor 378B, heat transfer fluid is drawn from a common secondary reservoir (e.g., secondary reservoir 379) and dispensed into the hot reservoir 378A as replenishment at operation 1371 (e.g., for a fixed time or until a second level sensor is tripped). If the heat transfer fluid level is above the low level, the method 1350 proceeds to operation 1361 where any excess heat transfer fluid from the HTX loop is removed from the hot reservoir 378A, for example through overflow and gravity into the secondary reservoir 379.

The method 1350 is similar for the chiller loop, beginning at operation 1352 with circulating the heat transfer fluid between the chamber 305 and the cold reservoir 377A of the chiller 377. If a low level is sensed (e.g., by the LL sensor 377B, heat transfer fluid is drawn from a common secondary reservoir (e.g., secondary reservoir 379) and dispensed into the cold reservoir 377A as replenishment at operation 1372 (e.g., for a fixed time or until a second level sensor is tripped). If the heat transfer fluid level is above the low level, the method 1350 proceeds to operation 1362 where any excess heat transfer fluid from the chiller loop is removed from the cold reservoir 377A, for example through overflow and gravity into the secondary reservoir 379.

Figure 4:
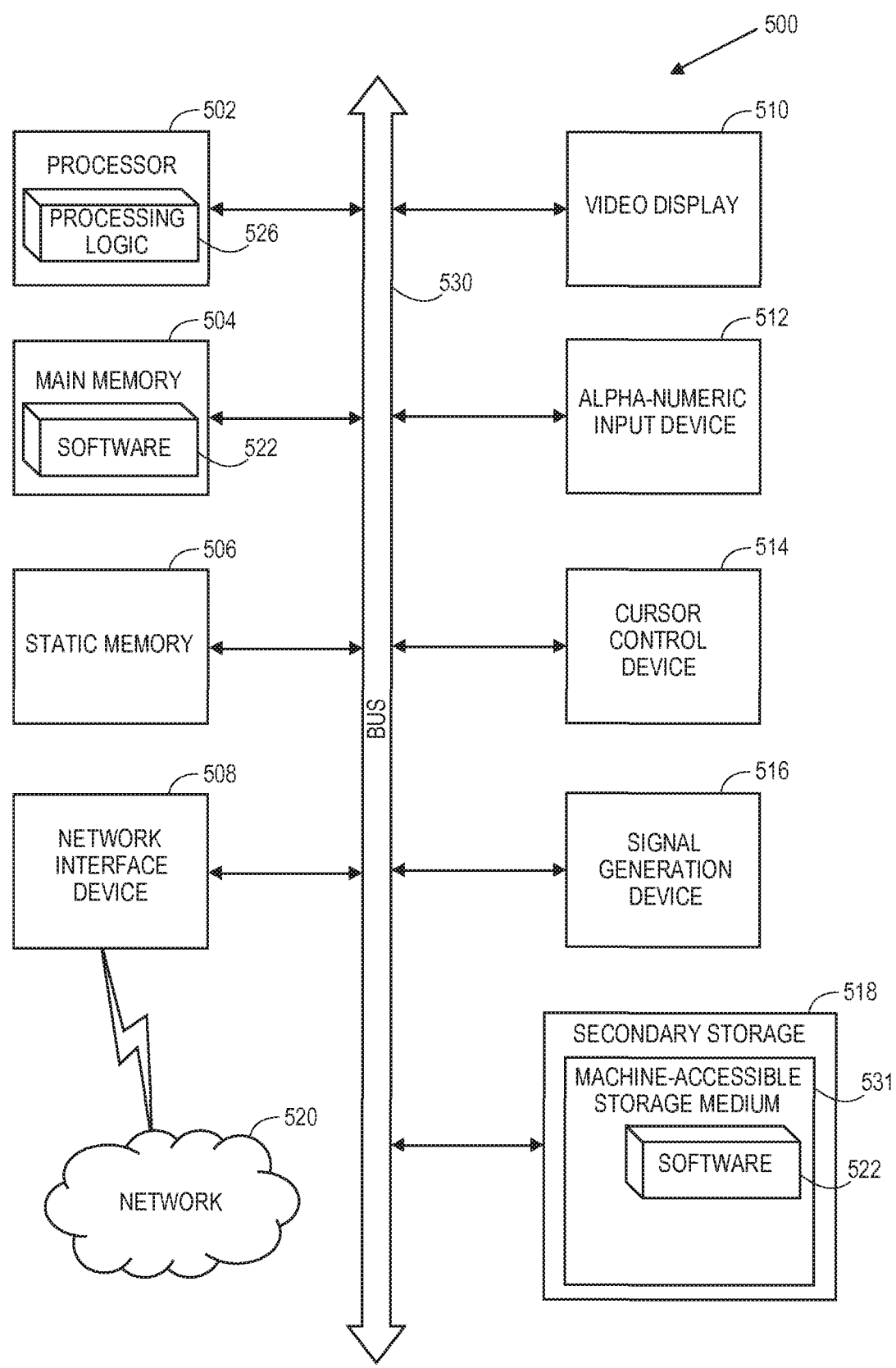
FIG. 4 illustrates a block diagram of an exemplary computer system incorporated into the plasma etch system depicted in FIG. 3, in accordance with one embodiment of the present invention.

FIG. 4 illustrates a diagrammatic representation of a machine in the exemplary form of a computer system 500 which may be utilized to perform the temperature control operations described herein, such as the controlling of valves in the heating and cooling loops illustrated in FIG. 1. In one embodiment, the computer system 500 may be provisioned as the controller 370 in the plasma etch system 300 with processor 502 serving as the CPU 372 and the network interface device 508 providing at least some of the functionality represented by I/O 374 in FIG. 1. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein.

The exemplary computer system 500 includes a processor 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a secondary memory 518 (e.g., a data storage device), which communicate with each other via a bus 530.

The processor 502 represents one or more general-purpose processing devices such as a microprocessor, central processing unit, or the like. More particularly, the processor 502 may be a complex instruction set computing (CISC) microprocessor, reduced instruction set computing (RISC) microprocessor, very long instruction word (VLIW) microprocessor, processor implementing other instruction sets, or processors implementing a combination of instruction sets. The processor 502 may also be one or more special-purpose processing devices such as an application specific integrated circuit (ASIC), a field programmable gate array (FPGA), a digital signal processor (DSP), network processor, or the like. The processor 502 is configured to execute the processing logic 526 for performing the temperature control operations discussed elsewhere herein.

The computer system 500 may further include a network interface device 508. The computer system 500 also may include a video display unit 510 (e.g., a liquid crystal display (LCD) or a cathode ray tube (CRT)), an alphanumeric input device 512 (e.g., a keyboard), a cursor control device 514 (e.g., a mouse), and a signal generation device 516 (e.g., a speaker).

The secondary memory 518 may include a machine-accessible storage medium (or more specifically a computer-readable storage medium) 531 on which is stored one or more sets of instructions (e.g., software 522) embodying any one or more of the temperature control algorithms described herein. The software 522 may also reside, completely or at least partially, within the main memory 504 and/or within the processor 502 during execution thereof by the computer system 500, the main memory 504 and the processor 502 also constituting machine-readable storage media. The software 522 may further be transmitted or received over a network 520 via the network interface device 508.

The machine-accessible storage medium 531 may further be used to store a set of instructions for execution by a processing system and that cause the system to perform any one or more of the temperature control algorithms described herein. Embodiments of the present invention may further be provided as a computer program product, or software, that may include a machine-readable medium having stored thereon instructions, which may be used to program a computer system (or other electronic devices) to control a plasma processing chamber temperature according to the present invention as described elsewhere herein. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, and other non-transitory storage media.

It is to be understood that the above description is intended to be illustrative, and not restrictive. For example, while flow diagrams in the figures show a particular order of operations performed by certain embodiments of the invention, it should be understood that such order is not required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A method of controlling a temperature of a chuck in a plasma processing apparatus, the method comprising:
   circulating a first heat transfer fluid at a first temperature through the chuck via a first supply line and a first return line coupling the chuck to a first primary heat transfer fluid reservoir;
   circulating a second heat transfer fluid at a second temperature through the chuck via a second supply line and a second return line coupling the chuck to a second primary heat transfer fluid reservoir;
   controlling a first valve disposed in-line with the first supply line and controlling a second valve disposed in-line with the second supply line; and
   maintaining a level of the first primary heat transfer fluid reservoir by catching overflow by gravity from the first primary heat transfer fluid reservoir in a secondary reservoir, the overflow from gravity from above and directly over the secondary reservoir, and dispensing heat transfer fluid from the secondary reservoir to the first primary heat transfer fluid reservoir by a first replenish conduit separate from the first supply line and first return line in response to sensing a low level in the first primary heat transfer fluid reservoir.

2. The method of claim 1, wherein controlling the first valve further comprises modulating a pulse width modulation duty cycle driving the first valve between a fully open state and a fully closed state.

3. The method of claim 1, wherein controlling the second valve further comprises modulating a pulse width modulation duty cycle driving the second valve between a fully open state and a fully closed state, and wherein the first valve is to be in the off state when the second valve is in the on state.

4. The method of claim 1, further comprising maintaining a level of the second primary heat transfer fluid reservoir by catching overflow by gravity from the second primary heat transfer fluid reservoir in the secondary reservoir, the overflow from gravity from above and directly over the secondary reservoir, and dispensing heat transfer fluid from the secondary reservoir to the second primary heat transfer fluid reservoir by a second replenish conduit separate from the second supply line and second return line in response to sensing a low level in the second primary heat transfer fluid reservoir.

5. The method of claim 4, wherein catching overflow from the first primary heat transfer fluid reservoir in the secondary reservoir further comprises collecting gravity fed runoff from a drain disposed within the first primary heat transfer fluid reservoir, and wherein catching overflow from the second primary heat transfer fluid reservoir in the secondary reservoir further comprises collecting gravity fed runoff from a drain disposed within the second primary heat transfer fluid reservoir.

6. The method of claim 5, further comprising allowing the overflow from the first and second primary heat transfer fluid reservoirs to mix within the secondary reservoir.

7. The method of claim 4, wherein dispensing heat transfer fluid from the secondary reservoir to the first primary heat transfer fluid reservoir further comprises pumping the heat transfer fluid through the first replenish conduit coupling the secondary reservoir to the first primary heat transfer fluid reservoir.

8. The method of claim 7, wherein dispensing heat transfer fluid from the secondary reservoir to the second primary heat transfer fluid reservoir further comprises pumping the heat transfer fluid through the second replenish conduit coupling the secondary reservoir to the second primary heat transfer fluid reservoir.

9. The method of claim 8, wherein the pumping is performed by first and second pumps, the first pump coupled to the first replenish conduit and the second pump coupled to the second replenish conduit.

10. The method of claim 1, wherein dispensing heat transfer fluid from the secondary reservoir to the first primary heat transfer fluid reservoir further comprises pumping the heat transfer fluid through the first replenish conduit coupling the secondary reservoir to the first primary heat transfer fluid reservoir.

11. The method of claim 10, wherein the pumping is performed by a first pump.

\* \* \* \* \*